(12) United States Patent
Lee

(10) Patent No.: US 10,888,008 B1
(45) Date of Patent: Jan. 5, 2021

(54) INSULATION COVER FIXING STRUCTURE AND PROTECTION DEVICE

(71) Applicant: Chicony Power Technology Co., Ltd., New Taipei (TW)

(72) Inventor: Po-Sheng Lee, New Taipei (TW)

(73) Assignee: CHICONY POWER TECHNOLOGY CO., LTD., New Taipei (TW)

(*) Notice: Subject to any disclaimer, the term of this patent is extended or adjusted under 35 U.S.C. 154(b) by 0 days.

(21) Appl. No.: 16/827,676

(22) Filed: Mar. 23, 2020

(30) Foreign Application Priority Data

Sep. 10, 2019 (CN) .......................... 2019 1 0855241

(51) Int. Cl.
- *H05K 9/00* (2006.01)
- *H05K 5/03* (2006.01)
- *H05K 5/00* (2006.01)

(52) U.S. Cl.
CPC ............. *H05K 5/03* (2013.01); *H05K 5/0013* (2013.01); *H05K 9/0007* (2013.01); *H05K 9/0045* (2013.01)

(58) Field of Classification Search
CPC ............................ H05K 9/0007; H05K 9/0045
See application file for complete search history.

(56) References Cited

U.S. PATENT DOCUMENTS

| | | | |
|---|---|---|---|
| 5,164,542 A * | 11/1992 | Hart | G06F 1/1626 174/383 |
| 5,906,310 A | 5/1999 | Vinciarelli et al. | |
| 6,593,524 B1 * | 7/2003 | Toedtman | H05K 9/0045 174/363 |
| 6,709,291 B1 * | 3/2004 | Wallace | H05K 5/0034 439/607.01 |
| 7,239,519 B2 | 7/2007 | Guo et al. | |
| 7,450,388 B2 | 11/2008 | Beihoff | |
| 7,534,968 B2 | 5/2009 | English et al. | |

(Continued)

FOREIGN PATENT DOCUMENTS

| | | |
|---|---|---|
| CN | 2009800337 Y | 11/2007 |
| CN | 206977302 U | 2/2018 |

(Continued)

OTHER PUBLICATIONS

Office Action dated Apr. 9, 2020 of the corresponding Taiwan patent application No. 108135470.

*Primary Examiner* — Hung V Ngo
(74) *Attorney, Agent, or Firm* — Chun-Ming Shih; HDLS IPR Services

(57) ABSTRACT

An insulation cover fixing structure and a protection device include a first insulation, a first metal shielding cover and an engaging unit. The first insulation cover includes a first bottom plate and a first side plate. The first metal shielding cover is disposed at an outer side of the first insulation cover. The first metal shielding cover includes a second bottom plate and a second side plate. The engaging unit is disposed on at least one of the first insulation cover and the first metal shielding cover. The first metal shielding cover and the first insulation cover are fixed by the engaging unit. The engaging unit includes a first tongue extended with bend from one of the first side plate and the second side plate toward the other and a second tongue extended from the first tongue. The second tongue is pressed against the other of the first side plate and the second side plate.

10 Claims, 6 Drawing Sheets

(56) References Cited

U.S. PATENT DOCUMENTS

| | | | |
|---|---|---|---|
| 10,063,038 B1 | 8/2018 | Lin | |
| 2012/0055824 A1* | 3/2012 | Nash | H05K 9/0045 |
| | | | 206/320 |
| 2016/0037690 A1* | 2/2016 | Nomizo | H05K 9/0049 |
| | | | 174/386 |

FOREIGN PATENT DOCUMENTS

| | | |
|---|---|---|
| CN | 208112496 U | 11/2018 |
| TW | 200709765 A | 3/2007 |
| TW | M385862 U | 8/2010 |
| TW | I369175 B | 7/2012 |

\* cited by examiner

INSULATION COVER FIXING STRUCTURE AND PROTECTION DEVICE

BACKGROUND OF THE INVENTION

Field of the Invention

The present invention generally relates to an insulation cover fixing structure and a protection device applied to a power conversion module.

Description of Prior Art

The insulation cover is an important mechanical safety component in the current power supply design, which is mainly designed to solve problems of electromagnetic interference, electromagnetic compatibility and heat dissipation. In the application of design, it is also necessary to consider the safety certification so that the product can meet the test requirements. In the existing insulation cover fixing structure, the insulation cover and the metal shielding cover need to be fixed with double-sided adhesive. Since the double-sided adhesive is often deteriorated by heat, the insulation cover is easily displaced under the action of external force; thereby, the insulation and protection performance of insulation cover will be reduced.

SUMMARY OF THE INVENTION

The present invention provides an insulation cover fixing structure and a protection device that do not need to be fixed by double-sided adhesive but are fastened by engaging.

The present invention provides an insulation cover fixing structure for a power conversion module comprising a first insulation, a first metal shielding cover and an engaging unit. The first insulation cover includes a first bottom plate and a first side plate extended perpendicularly from a side of the first bottom plate, and the power conversion module is disposed on the first insulation cover. The first metal shielding cover is disposed at an outer side of the first insulation cover. The first metal shielding cover includes a second bottom plate and a second side plate extended perpendicularly from a side of the second bottom plate. The engaging unit is disposed on at least one of the first insulation cover and the first metal shielding cover. The first metal shielding cover and the first insulation cover are fixed by the engaging unit. The engaging unit includes a first tongue extended with bend from one of the first side plate and the second side plate toward the other and a second tongue extended from the first tongue. The second tongue is pressed against the other of the first side plate and the second side plate.

One of the exemplary embodiments, the first tongue is extended with bend from the second side plate toward the first side plate, and the second tongue is pressed against the first side plate.

One of the exemplary embodiments, the engaging unit further includes a first through hole formed on the first side plate, and the first tongue is inserted through the first through hole.

One of the exemplary embodiments, the engaging unit further includes a first through hole formed on the second side plate; the first tongue is extended with bend from the first side plate toward the second side plate and is inserted through the first through hole. The second tongue is pressed against the second side plate.

One of the exemplary embodiments, the first insulation cover further includes a third side plate extended perpendicularly from another side of the first bottom plate; the first metal shielding cover further includes a fourth side plate extended perpendicularly from another side of the second bottom plate; the engaging unit further includes a third tongue extended with bend from the fourth side plate toward the third side plate and a fourth tongue extended from the third tongue. The fourth tongue is pressed against the third side plate.

One of the exemplary embodiments, the engaging unit further includes a second through hole formed on the third side plate, and the third tongue is inserted through the second through hole.

One of the exemplary embodiments, the engaging unit further includes a third tongue extended with bend from the second bottom plate toward the first bottom plate and a fourth tongue extended from the third tongue. The fourth tongue is pressed against the first bottom plate.

One of the exemplary embodiments, the first insulation cover further includes a third side plate extended perpendicularly from another side of the first bottom plate; the first metal shielding cover further includes a fourth side plate extended perpendicularly from another side of the second bottom plate; the engaging unit further includes a third tongue extended with bend from the third side plate toward the fourth side plate, a fourth tongue extended from the third tongue and a second through hole formed on the fourth side plate; and the third tongue is inserted through the second through hole. The fourth tongue is pressed against the fourth side plate.

The present invention provides a protection device for a power conversion module comprising a first insulation cover, a first metal shielding cover, an engaging unit, a second metal shielding cover and a second insulation cover. The first insulation cover includes a first bottom plate, a first side plate extended perpendicularly from a side of the first bottom plate and a third side plate extended perpendicularly from another side of the first bottom plate, and the power conversion module is disposed on the first insulation cover. The first metal shielding cover is disposed at an outer side of the first insulation cover. The first metal shielding cover includes a second bottom plate, a second side plate extended perpendicularly from a side of the second bottom plate and a fourth side plate extended perpendicularly from another side of the second bottom plate. The engaging unit is disposed on at least one of the first insulation cover and the first metal shielding cover. The first metal shielding cover and the first insulation cover are fixed by the engaging unit. The engaging unit includes a first tongue extended with bend from one of the first side plate and the second side plate toward the other, a second tongue extended from the first tongue, a third tongue extended with bend from one of the third side plate and the fourth side plate toward the other and a fourth tongue extended from the third tongue. The second tongue is pressed against the other of the first side plate and the second side plate. The fourth tongue is pressed against the other of the third side plate and the fourth side plate. The second metal shielding cover is combined with the first metal shielding cover. The second insulation cover is disposed at an inner side of the second metal shielding cover and is combined with the first insulation cover, wherein the first insulation cover, the first metal shielding cover, the second metal shielding cover and the second insulation cover are configured to form a box structure together.

One of the exemplary embodiments, the first tongue is extended from the second side plate toward the first side plate, and the second tongue is pressed against the first side plate; the third tongue is extended from the fourth side plate toward the third side plate. The fourth tongue is pressed against the third side plate.

The effects of the present invention are summarized as follows. Firstly, the design of the product can avoid the displacement of the insulation cover caused by an external stress. Secondly, the double-sided tape is cancelled and the engaging unit is used for fixing. Thirdly, the production per hour of automation can be increased from 800 to over 1500. Fourthly, the equipment of automation can be simplified, and the cost of establishment and configuration of equipment of automation can be reduced.

BRIEF DESCRIPTION OF DRAWINGS

The features of the invention believed to be novel are set forth with particularity in the appended claims. The invention itself, however, may be best understood by reference to the following detailed description of the invention, which describes a number of exemplary embodiments of the invention, taken in conjunction with the accompanying drawings, in which:

DETAILED DESCRIPTION OF THE PREFERRED EMBODIMENTS

In cooperation with attached drawings, the technical contents and detailed description of the invention are described thereinafter according to a number of preferable embodiments, being not used to limit its executing scope. Any equivalent variation and modification made according to appended claims is all covered by the claims claimed by the present invention.

Figure 1A:
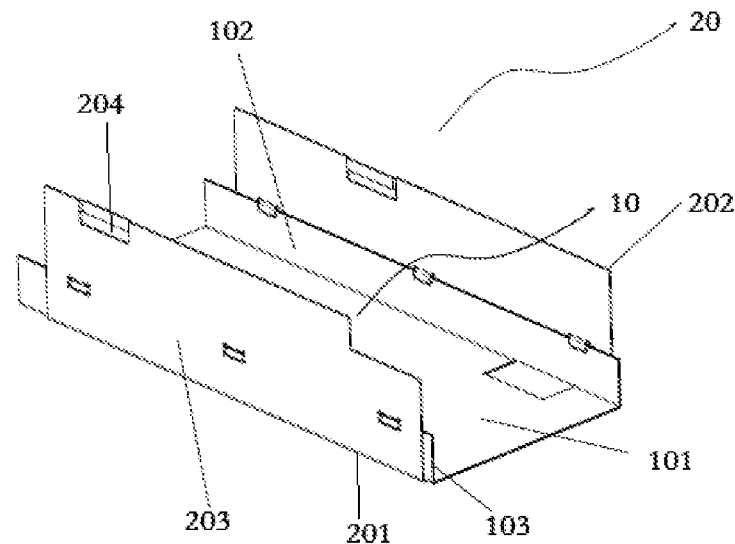
FIG. 1A is a schematic view of the first embodiment of assembly of the insulation cover fixing structure of the present invention.
Figure 1B:
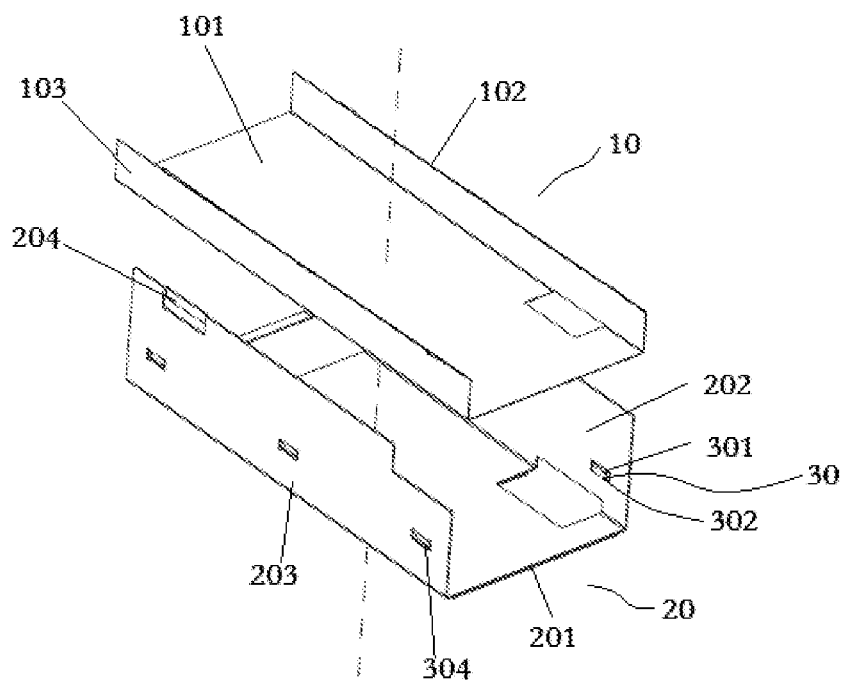
FIG. 1B is an explosion schematic view of the first embodiment of the insulation cover fixing structure of the present invention.
Figure 1C:
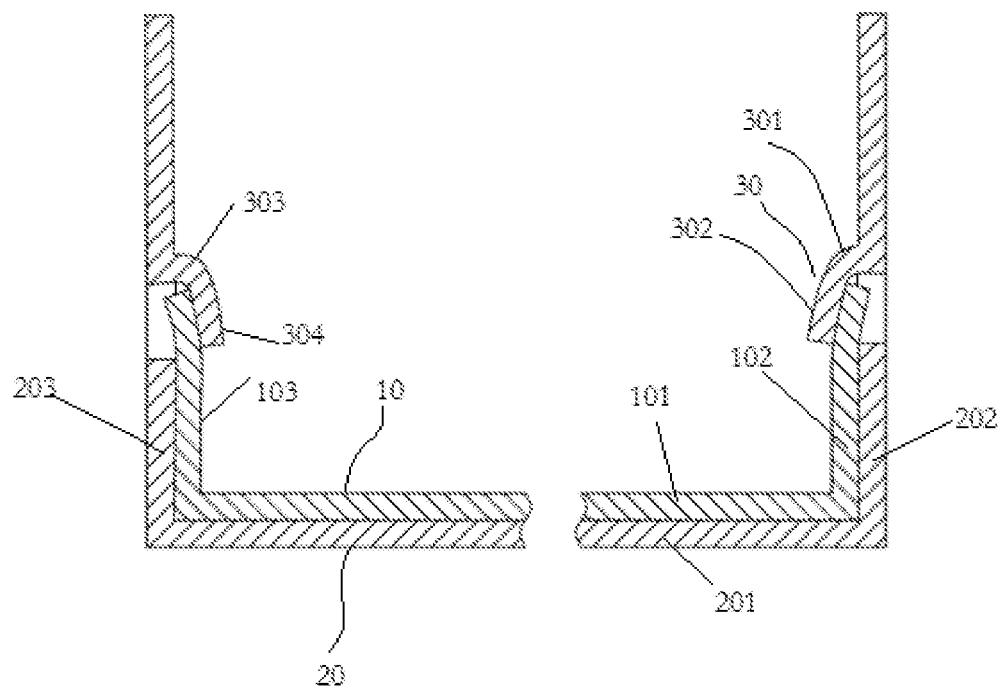
FIG. 1C is a cross sectional schematic view of the first embodiment of the insulation cover fixing structure of the present invention.

Please refer to FIG. 1A to FIG. 1C. FIG. 1A is a schematic view of the first embodiment of assembly of the insulation cover fixing structure of the present invention. FIG. 1B is an explosion schematic view of the first embodiment of the insulation cover fixing structure of the present invention. FIG. 1C is a cross sectional schematic view of the first embodiment of the insulation cover fixing structure of the present invention. The present invention provides an insulation cover fixing structure for a power conversion module (not shown). The insulation cover fixing structure comprises a first insulation cover 10, a first metal shielding cover 20 and an engaging unit 30. The first insulation cover 10 includes a first bottom plate 101 and a first side plate 102 extended perpendicularly from a side of the first bottom plate 101, and the power conversion module is disposed on the first insulation cover 10. The first metal shielding cover 20 is disposed at an outer side of the first insulation cover 10. The first metal shielding cover 20 includes a second bottom plate 201 and a second side plate 202 extended perpendicularly from a side of the second bottom plate 201. The engaging unit 30 is disposed on at least one of the first insulation cover 10 and the first metal shielding cover 20. The first metal shielding cover 20 and the first insulation cover 10 are fixed by the engaging unit 30. The engaging unit 30 includes a first tongue 301 extended with bend from one of the first side plate 102 and the second side plate 202 toward the other and a second tongue 302 extended from the first tongue 301. The second tongue is pressed against the other of the first side plate 102 and the second side plate 202.

Please refer to FIG. 1C. FIG. 1C is a cross sectional schematic view of the first embodiment of the insulation cover fixing structure of the present invention. In the present embodiment, the first tongue 301 is extended with bend from the second side plate 202 toward the first side plate 102, and the second tongue 302 is pressed against the first side plate 102. In the embodiment, the first tongue 301 and the second tongue 302 are integrally formed.

With referring to FIG. 1A to FIG. 1C, the first insulation cover 10 further includes a third side plate 103 extended perpendicularly from another side of the first bottom plate 101. The first metal shielding cover 20 further includes a fourth side plate 203 extended perpendicularly from another side of the second bottom plate 201. The engaging unit 30 further includes a third tongue 303 extended with bend from the fourth side plate 203 toward the third side plate 103 and a fourth tongue 304 extended from the third tongue 303. The fourth tongue 304 is pressed against the third side plate 103. In the present embodiment, the third tongue 303 and the fourth tongue 304 are integrally formed.

In the first embodiment, the first insulation cover 10 has a U-shaped cross section, and the first metal shielding cover 20 also has a U-shaped cross section. In the present embodiment, the height of the first side plate 102 is lower than that of the second side plate 202, and the height of the third side plate 103 is also lower than that of the fourth side plate 203. The engaging unit 30 is pressed against the upper edges of the first side plate 102 and the third side plate 103. Specifically, the upper edge of the first side plate 102 is tightly pressed by the second tongue 302, and the upper edge of the third side plate 103 is tightly pressed by the fourth tongue 304; therefore, the first insulation cover 10 and the first metal shielding cover 20 will be fixed by pressing without any additional fixing elements; thus, work procedures of using double-sided tapes and pasting can be eliminated.

In the present embodiment, the first metal shielding cover 20 further includes a louvered opening 204 disposed on the fourth side plate 203. The louvered opening 204 is used for engaging a second metal shielding cover (see FIG. 5).

It should be noted that, in this embodiment, the engaging unit 30 may further includes other tongues such as fifth to twelfth tongues as shown in FIG. 1A and FIG. 1B, and the present invention is not limited thereto.

Figure 2:
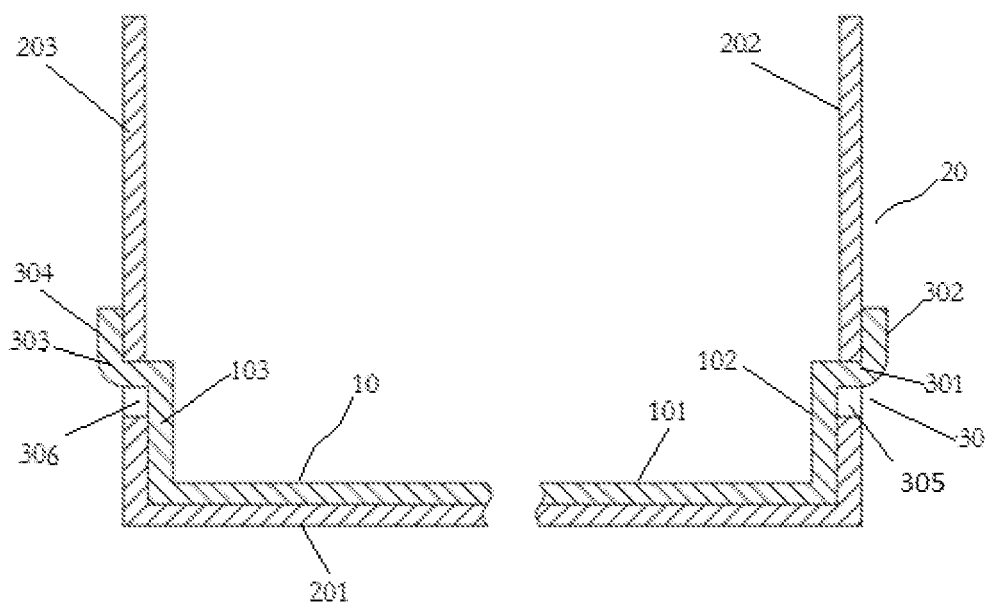
FIG. 2 is a cross sectional schematic view of the second embodiment of the insulation cover fixing structure of the present invention.

Please refer to FIG. 2. FIG. 2 is a cross sectional schematic view of the second embodiment of the insulation cover fixing structure of the present invention. The second embodiment is substantially the same as the first embodiment. The difference is that, in the present embodiment, the engaging unit 30 further includes a first through hole 305 formed on the second side plate 202, and the first tongue 301 is extended with bend from the first side plate 102 toward the second side plate 202. In the present embodiment, the first tongue 301 is extended with bend from the upper edge of the first side plate 102 toward the second side plate 202 and is inserted through the first through hole 305. The second tongue 302 extended from the first tongue 301 is pressed against the upper side of the first through hole 305 of the second side plate 202. In the embodiment, the first tongue 301 and the second tongue 302 are integrally formed.

Please refer to FIG. 2, in the second embodiment, the first insulation cover 10 further includes a third side plate 103 extended perpendicularly from another side of the first bottom plate 101. The first metal shielding cover 20 further includes a fourth side plate 203 extended perpendicularly from another side of the second bottom plate 201. The engaging unit 30 further includes a third tongue 303 extended with bend from the third side plate 103 toward the fourth side plate 203, a fourth tongue 304 extended from the third tongue 303 and a second through hole 306 formed on the fourth side plate 203. Besides, the third tongue 303 is inserted through the second through hole 306. The fourth tongue 304 is pressed against the upper side of the second through hole 306 of the fourth side plate 203. In the present embodiment, the third tongue 303 and the fourth tongue 304 are integrally formed.

In the second embodiment, the first insulation cover 10 has a U-shaped cross section, and the first metal shielding cover 20 also has a U-shaped cross section. In the present embodiment, the height of the first side plate 102 is lower than that of the second side plate 202, and the height of the third side plate 103 is also lower than that of the fourth side plate 203. Specifically, the first tongue 301 and the third tongue 303 are inserted through the first through hole 305 and the second through hole 306 respectively; the second tongue 302 and the fourth tongue 304 are pressed against the second side plate 202 and the fourth side plate 203 respectively. Therefore, the first insulation cover 10 and the first metal shielding cover 20 will be fixed by engaging without any additional fixing elements; thus, work procedures of using double-sided tapes and pasting can be eliminated.

Figure 3:
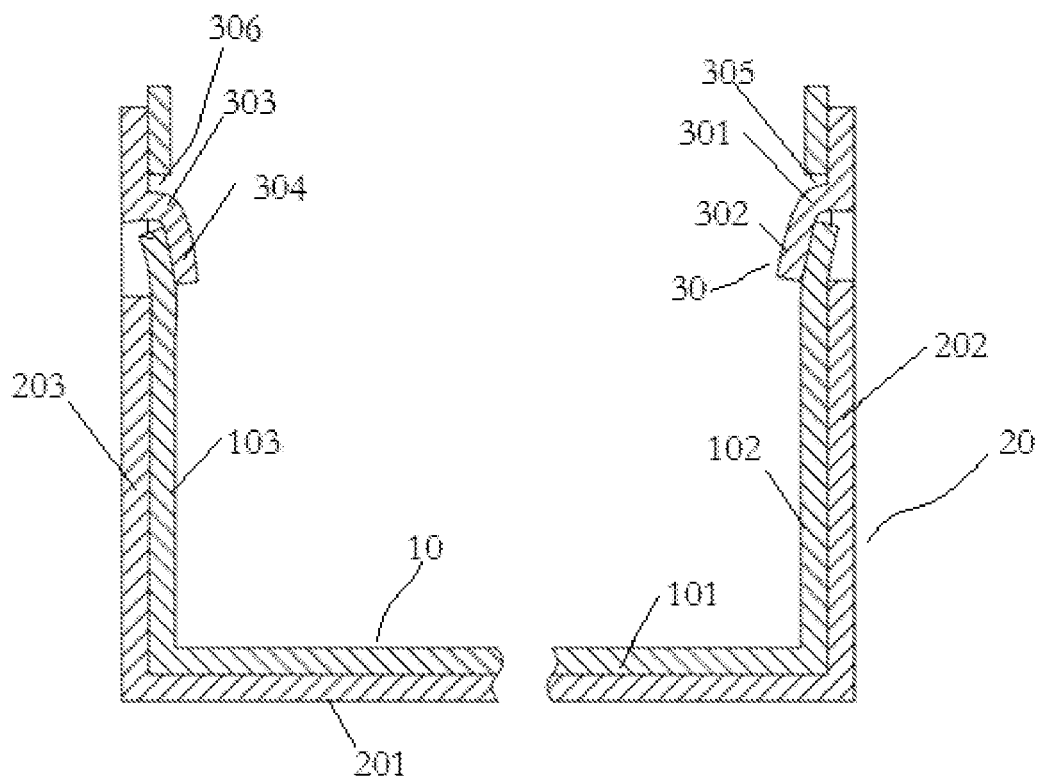
FIG. 3 is a cross sectional schematic view of the third embodiment of the insulation cover fixing structure of the present invention.

Please refer to FIG. 3. The FIG. 3 is a cross sectional schematic view of the third embodiment of the insulation cover fixing structure of the present invention. The third embodiment is substantially the same as the first embodiment. The difference is that, in the present embodiment, the first tongue 301 is extended with bend from the second side plate 202 toward the first side plate 102, and the engaging unit 30 further includes a first through hole 305 formed on the first side plate 102. Specifically, the first tongue 301 is extended with bend from the middle portion or the upper portion of the second side plate 202 and is inserted through the first through hole 305. The second tongue 302 extended from the first tongue 301 is pressed against the lower side of the first through hole 305 of the first side plate 102. In the present embodiment, the first tongue 301 and the second tongue 302 are integrally formed.

Please refer to FIG. 3. The first insulation cover 10 further includes a third side plate 103 extended perpendicularly from another side of the first bottom plate 101. The first metal shielding cover 20 further includes a fourth side plate 203 extended perpendicularly from another side of the second bottom plate 201. The engaging unit 30 further includes a third tongue 303 extended with bend from the fourth side plate 203 toward the third side plate 103, a fourth tongue 304 extended from the third tongue 303 and a second through hole 306 formed on the third side plate 103. The third tongue 303 is inserted through the second through hole 306. The fourth tongue 304 is pressed against the lower side of the second through hole 306 of the third side plate 103. In the present embodiment, the third tongue 303 and the fourth tongue 304 are integrally formed.

In the third embodiment, the first insulation cover 10 has a U-shaped cross section, and the first metal shielding cover 20 also has a U-shaped cross section. In the present embodiment, the height of the first side plate 102 is higher than that of the second side plate 202, and the height of the third side plate 103 is also higher than that of the fourth side plate 203. Specifically, the first tongue 301 and the third tongue 303 are inserted through the first through hole 305 and the second through hole 306 respectively; the second tongue 302 and the fourth tongue 304 are pressed against the first side plate 102 and the third side plate 103 respectively. Therefore, the first insulation cover 10 and the first metal shielding cover 20 will be fixed by engaging without any additional fixing elements; thus, work procedures of using double-sided tapes and pasting can be eliminated.

Figure 4:
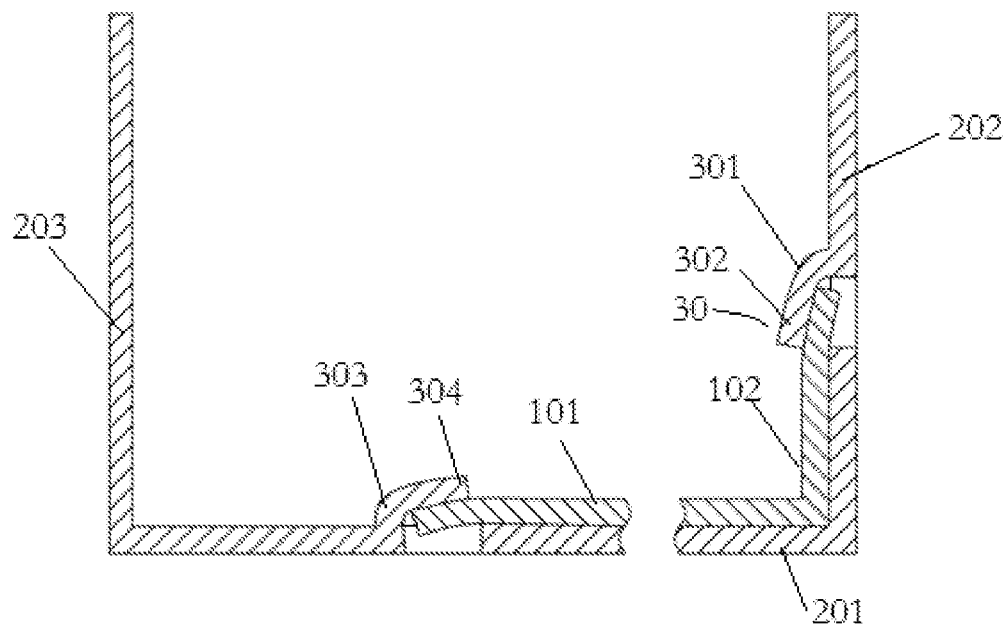
FIG. 4 is a cross sectional schematic view of the fourth embodiment of the insulation cover fixing structure of the present invention.

Please refer to FIG. 4. FIG. 4 is a cross sectional schematic view of the fourth embodiment of the insulation cover fixing structure of the present invention. The fourth embodiment is substantially the same as the first embodiment. The difference is that, in the present embodiment, the first insulation cover 10 has an L-shaped cross section, and the first metal shielding cover 20 has a U-shaped cross section. In the present embodiment, the first tongue 301 is extended with bend from the second side plate 202 toward the first side plate 102, and the second tongue 302 is pressed against the first side plate 102. In the embodiment, the first tongue 301 and the second tongue 302 are integrally formed. The engaging unit 30 further includes a third tongue 303 extended with bend from the second bottom plate 201 and a fourth tongue 304 extended from the third tongue 303. The fourth tongue 304 is pressed against the first bottom plate 101. In the present embodiment, the third tongue 303 and the fourth tongue 304 are integrally formed.

In the fourth embodiment, the height of the first side plate 102 is lower than that of the second side plate 202, and the width of the first bottom plate 101 is smaller than that of the second bottom plate 201. The engaging unit 30 is pressed against the upper edge of the first side plate 102 and another side of the first bottom plate 101. Specifically, the upper edge of the first side plate 102 is tightly pressed by the second tongue 302, and another side of the first bottom plate 101 is tightly pressed by the fourth tongue 304. Therefore, the first insulation cover 10 and the first metal shielding cover 20 will be fixed by pressing without any additional fixing elements; thus, work procedures of using double-sided tapes and pasting can be eliminated.

Figure 5:
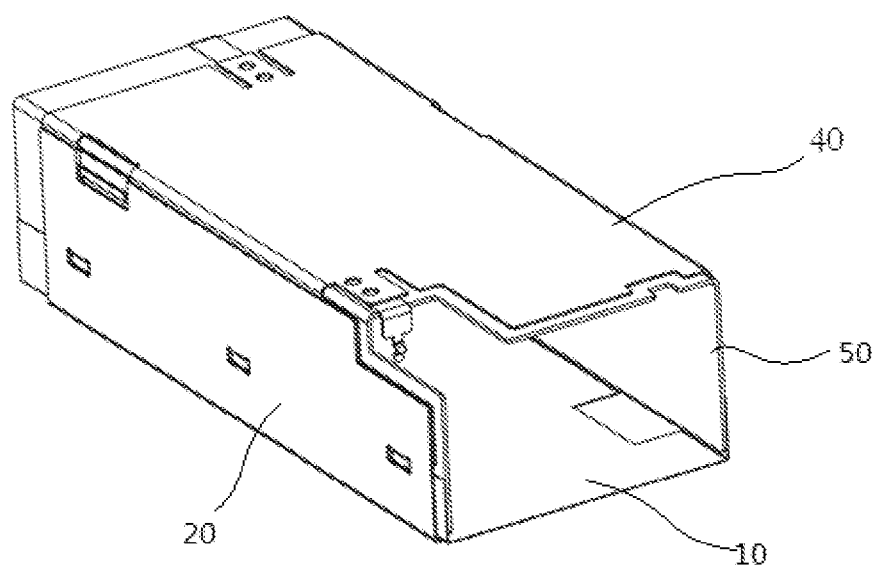
FIG. 5 is a schematic view of assembly of the protection device of the present invention.
Figure 6:
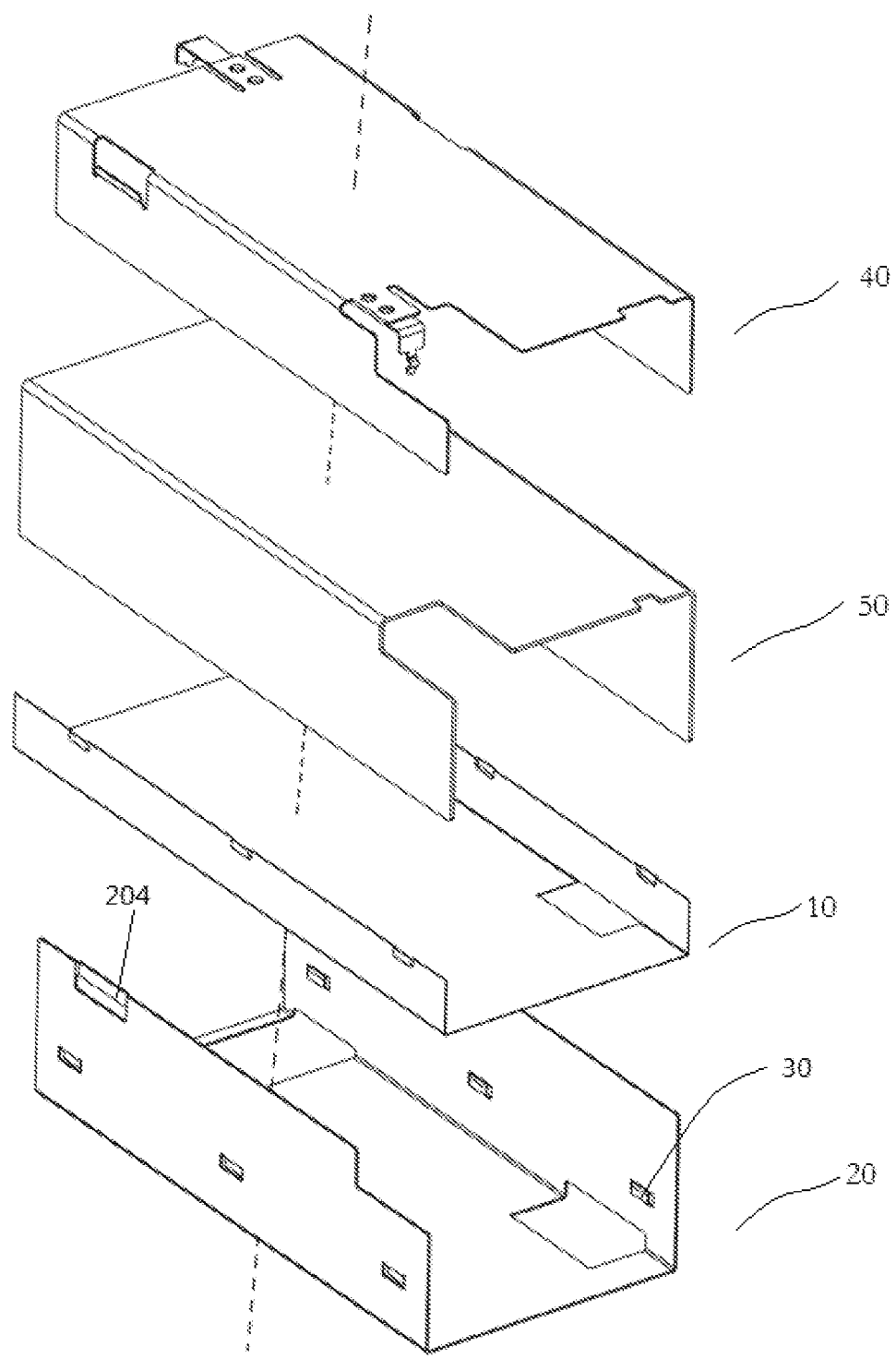
FIG. 6 is an explosion schematic view of the protection device of the present invention.
Figure 7:
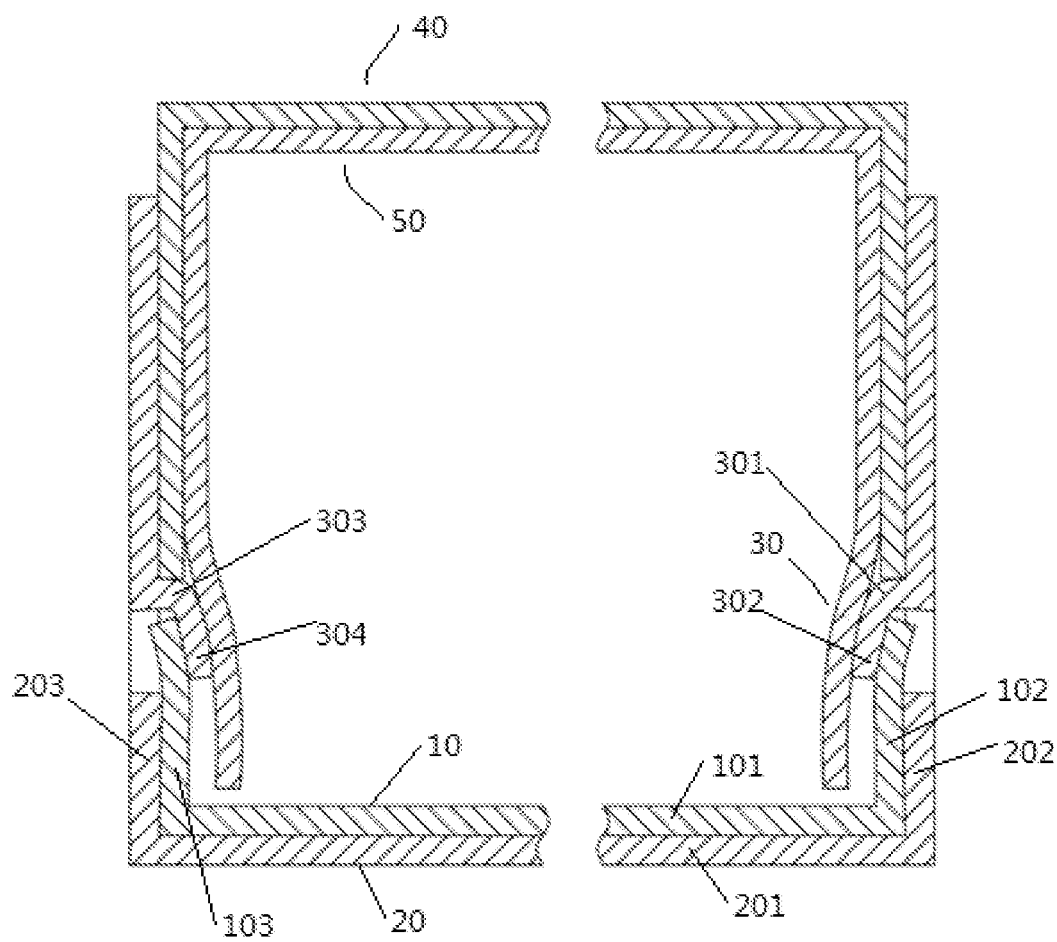
FIG. 7 is a cross sectional schematic view of the protection device of the present invention.

Please refer to FIG. 5 to FIG. 7. FIG. 5 is a schematic view of assembly of the protection device of the present invention. FIG. 6 is an explosion schematic view of the protection device of the present invention. FIG. 7 is a cross sectional schematic view of the protection device of the present invention. The present invention provides a protection device for a power conversion module (not shown). The protection device includes a first insulation cover 10, a first metal shielding cover 20, an engaging unit 30, a second metal shielding cover 40 and a second insulation cover 50.

The first insulation cover 10 includes a first bottom plate 101, a first side plate 102 extended perpendicularly from a side of the first bottom plate 101 and a third side plate 103 extended perpendicularly from another side of the first bottom plate 101. The power conversion module is disposed on the first insulation cover 10.

The first metal shielding cover 20 is disposed at an outer side of the first insulation cover 10. The first metal shielding cover 20 includes a second bottom plate 201, a second side plate 202 extended perpendicularly from a side of the second bottom plate 201 and a fourth side plate 203 extended perpendicularly from another side of the second bottom plate 201. In the present embodiment, the first metal shielding cover 20 further includes a louvered opening 204 disposed on the fourth side plate 203. The louvered opening 204 is used for engaging the second metal shielding cover 40.

The engaging unit 30 is disposed on at least one of the first insulation cover 10 and the first metal shielding cover 20. The first metal shielding cover 20 and the first insulation cover 10 are fixed by the engaging unit 30. The engaging unit 30 includes a first tongue 301 extended with bend from one of the first side plate 102 and the second side plate 202 toward the other, a second tongue 302 extended from the first tongue 301, a third tongue 303 extended with bend from one of the third side plate 103 and the fourth side plate 203 toward the other and a fourth tongue 304 extended from the third tongue 303. The second tongue 302 is pressed against one of the first side plate 102 and the second side plate 202, and the fourth tongue 304 is pressed against one of the third side plate 103 and the fourth side plate 203.

In the present embodiment, the first tongue 301 is extended with bend from the second side plate 202 toward the first side plate 102, and the second tongue 302 is pressed against the first side plate 102. The third tongue 303 is extended with bend from the fourth side plate 203 toward the third side plate 103, and the fourth tongue 304 is pressed against the third side plate 103. In the embodiment, the first tongue 301 and the second tongue 302 are integrally formed, and the third tongue 303 and the fourth tongue 304 are integrally formed.

In the present embodiment, the first insulation cover 10 has a U-shaped cross section, and the first metal shielding cover 20 also has a U-shaped cross section. In the present embodiment, the height of the first side plate 102 is lower than that of the second side plate 202, and the height of the third side plate 103 is also lower than that of the fourth side plate 203. The engaging unit 30 is pressed against the upper edges of the first side plate 102 and the third side plate 103. Specifically, the upper edge of the first side plate 102 is tightly pressed by the second tongue 302, and the upper edge of the third side plate 103 is tightly pressed by the fourth tongue 302. Therefore, the first insulation cover 10 and the first metal shielding cover 20 will be fixed by pressing without any additional fixing elements; thus, work procedures of using double-sided tapes and pasting can be eliminated.

It should also be noted that, in this embodiment, the engaging unit 30 may further includes other tongues such as fifth to twelfth tongues as shown in FIG. 6, and the present invention is not limited thereto.

The second metal shielding cover 40 is combined with the first metal shielding cover 20.

The second insulation cover 50 is disposed at an inner side of the second metal shielding cover 40 and is combined with the first insulation cover 10.

The first insulation cover 10, the first metal shielding cover 20, the second metal shielding cover 40 and the second insulation cover 50 are configured to form a box structure together. The box structure can provide effects of shielding, insulation and heat conduction for the power conversion module.

At last, the effects of the present invention are summarized as follows. Firstly, the design of the product can avoid the displacement of the insulation cover caused by an external stress. Secondly, the double-sided tape is cancelled and the engaging unit is used for fixing. Thirdly, the production per hour of automation can be increased from 800 to over 1500. Fourthly, the equipment can be simplified and the cost of establishment and configuration of automation can be reduced.

Although the present invention has been described with reference to the preferred embodiment thereof, it will be understood that the invention is not limited to the details thereof. Various substitutions and improvements have been suggested in the foregoing description, and others will occur to those of ordinary skill in the art. Therefore, all such substitutions and improvements are intended to be embraced within the scope of the invention as defined in the appended claims.

What is claimed is:

1. An insulation cover fixing structure for a power conversion module, comprising:
    a first insulation cover including a first bottom plate and a first side plate extended perpendicularly from a side of the first bottom plate, and the power conversion module disposed on the first insulation cover;
    a first metal shielding cover disposed at an outer side of the first insulation cover; the first metal shielding cover including a second bottom plate and a second side plate extended perpendicularly from a side of the second bottom plate; and
    an engaging unit disposed on at least one of the first insulation cover and the first metal shielding cover; the first metal shielding cover and the first insulation cover being fixed by the engaging unit; the engaging unit including a first tongue extended with bend from one of the first side plate and the second side plate toward the other and a second tongue extended from the first tongue; and the second tongue being pressed against the other of the first side plate and the second side plate; wherein the second tongue is not embedded into the first insulation cover and the first metal shielding cover.

2. The insulation cover fixing structure according to claim 1, wherein the first tongue is extended with bend from the second side plate toward the first side plate, and the second tongue is pressed against the first side plate.

3. The insulation cover fixing structure according to claim 2, wherein the engaging unit further includes a first through hole formed on the first side plate, and the first tongue is inserted through the first through hole.

4. The insulation cover fixing structure according to claim 2, wherein the first insulation cover further includes a third side plate extended perpendicularly from another side of the first bottom plate; the first metal shielding cover further includes a fourth side plate extended perpendicularly from another side of the second bottom plate; the engaging unit further includes a third tongue extended with bend from the fourth side plate toward the third side plate and a fourth tongue extended from the third tongue; and the fourth tongue is pressed against the third side plate.

5. The insulation cover fixing structure according to claim 4, wherein the engaging unit further includes a second through hole formed on the third side plate, and the third tongue is inserted through the second through hole.

6. The insulation cover fixing structure according to claim 2, wherein the engaging unit further includes a third tongue extended with bend from the second bottom plate toward the first bottom plate and a fourth tongue extended from the third tongue; and the fourth tongue is pressed against the first bottom plate.

7. The insulation cover fixing structure according to claim 1, wherein the engaging unit further includes a first through hole formed on the second side plate; the first tongue is extended with bend from the first side plate toward the second side plate and is inserted through the first through hole; and the second tongue is pressed against the second side plate.

8. The insulation cover fixing structure according to claim 7, wherein the first insulation cover further includes a third side plate extended perpendicularly from another side of the first bottom plate; the first metal shielding cover further includes a fourth side plate extended perpendicularly from another side of the second bottom plate; the engaging unit further includes a third tongue extended with bend from the third side plate toward the fourth side plate, a fourth tongue extended from the third tongue and a second through hole formed on the fourth side plate; the third tongue is inserted through the second through hole; and the fourth tongue is pressed against the fourth side plate.

9. A protection device for a power conversion module, comprising:
   a first insulation cover including a first bottom plate, a first side plate extended perpendicularly from a side of the first bottom plate and a third side plate extended perpendicularly from another side of the first bottom plate, and the power conversion module disposed on the first insulation cover;
   a first metal shielding cover disposed at an outer side of the first insulation cover; the first metal shielding cover including a second bottom plate, a second side plate extended perpendicularly from a side of the second bottom plate and a fourth side plate extended perpendicularly from another side of the second bottom plate;
   an engaging unit disposed on at least one of the first insulation cover and the first metal shielding cover, the first metal shielding cover and the first insulation cover being fixed by the engaging unit; the engaging unit including a first tongue extended with bend from one of the first side plate and the second side plate toward the other, a second tongue extended from the first tongue, a third tongue extended with bend from one of the third side plate and the fourth side plate toward the other and a fourth tongue extended from the third tongue; the second tongue being pressed against the other of the first side plate and the second side plate; and the fourth tongue being pressed against the other of the third side plate and the fourth side plate;
   a second metal shielding cover combined with the first metal shielding cover; and
   a second insulation cover disposed at an inner side of the second metal shielding cover and combined with the first insulation cover;
   wherein the first insulation cover, the first metal shielding cover, the second metal shielding cover and the second insulation cover are configured to form a box structure together.

10. The protection device according to claim 9, wherein the first tongue is extended with bend from the second side plate toward the first side plate, and the second tongue is pressed against the first side plate; the third tongue is extended with bend from the fourth side plate toward the third side plate; and the fourth tongue is pressed against the third side plate.

* * * * *